United States Patent [19]

Fukuda

[11] 4,266,091
[45] May 5, 1981

[54] LAYER-BUILT LAMINATED BUS EMBEDDING CONDENSERS

[75] Inventor: Sunichi Fukuda, Kukizaki, Japan

[73] Assignee: Rogers Corporation, Rogers, Conn.

[21] Appl. No.: 950,266

[22] Filed: Oct. 10, 1978

[30] Foreign Application Priority Data

Oct. 8, 1977 [JP] Japan ............................. 52-121168

[51] Int. Cl.³ ............................................. H01B 7/00
[52] U.S. Cl. ................................. 174/72 B; 361/306
[58] Field of Search ....................... 174/72 B; 361/306

[56] References Cited

U.S. PATENT DOCUMENTS

| | | | |
|---|---|---|---|
| 1,999,137 | 4/1935 | Flewelling | 174/72 B X |
| 3,396,230 | 8/1968 | Crimmins | 174/72 B |
| 3,505,575 | 4/1970 | Barbini | 361/306 X |
| 3,778,735 | 12/1973 | Steenmetser | 174/72 B UX |
| 3,886,654 | 6/1975 | Erdle | 174/72 B X |
| 4,114,120 | 9/1978 | Lupfer | 361/306 X |

Primary Examiner—Roy N. Envall, Jr.
Attorney, Agent, or Firm—Fishman and Van Kirk

[57] ABSTRACT

A laminated bus bar comprises a pair of elongated flat conductors separated by a layer of insulating material which is provided with longitudinally spaced cut-outs. Capacitors which are comprised of a flat wafer of solid dielectric material are positioned in each of the cut-outs in the layer of insulating material and the capacitor plates are electrically and mechanically connected to the conductors.

11 Claims, 7 Drawing Figures

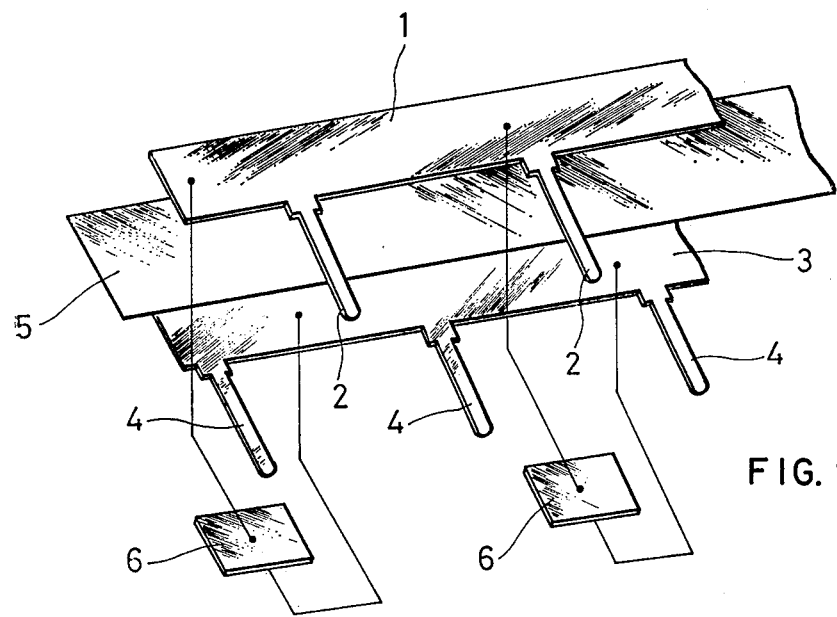
FIG. 1
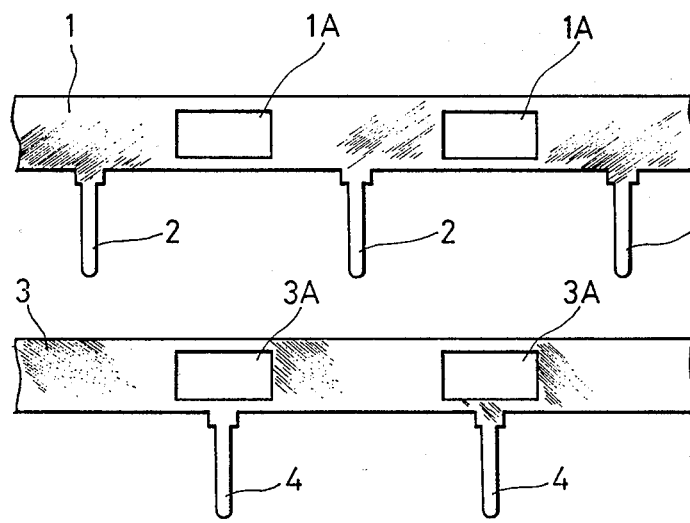
FIG. 2
FIG. 3

LAYER-BUILT LAMINATED BUS EMBEDDING CONDENSERS

The present invention relates to multi-layer or laminated bus bars which include embedded condensers. These bus bars are assembled such that an insulating material and conductors are overlapped to form said bus bar and wherein the condensers are embedded directly in the bus bar. Present trends toward increasingly high-density packaging of electronic parts and higher frequencies of operation have led to the requirement for bus bars characterized by low inductance and low impedance in order to avoid the undesirable effects of high-frequency noise.

Laminated bus bars are the most suitable manner of distributing electrical power and signals in the environment of a high density circuit, particularly plural integrated circuits, because of the flexibility in size and shape inherent to the manufacture thereof. However, there is a limit in the distributed capacity which can be obtained employing the dielectric sheet materials previously used as the insulation between the conductors of laminated bus bars.

As suitable means for resolving the above-discussed difficulty, various attempts have heretofore been made to use materials having a high dielectric constant to separate the conductors of a laminated bus bar. These attempts have, however, been unsuccessful largely because of the increased manufacturing costs incident to handling materials such as ceramics which have the requisite high dielectric constant.

Accordingly, the present invention is intended to provide a laminated bus bar with embedded condensers which is easy to assemble and characterized by flexibility in design. A bus bar in accordance with the present invention has capacitors incorporated directly in the bus bar and may be used to distribute power to an electronic circuit.

The invention will be explained in detail with reference to a preferred embodiment illustrated in the accompanying drawings.

FIG. 1 is a schematic view of a laminated bus bar with embedded capacitors in accordance with a preferred embodiment of the present invention.

FIGS. 2 and 3 are partially enlarged plan views of an example of bus conductors for use in the present invention.

In FIG. 1, there are shown bus conductors 1 and 3 having integral terminals 2 and 4, respectively, positioned at the required intervals. These conductors are arranged, with the required offset of respective integral terminals 2 and 4, through the interposition of an insulating film 5 between said conductors and the bus bar is then encapsulated by an insulating film (not shown).

Figure 4:
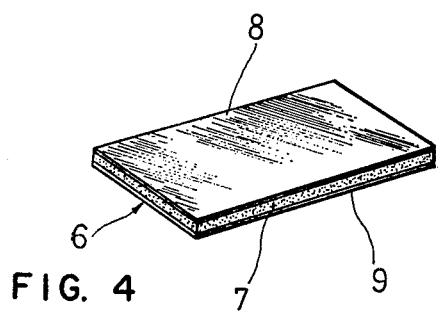
FIG. 4 is an enlarged perspective view of the construction of a capacitor for incorporation in a bus bar in accordance with the present invention.

The present invention comprises a novel bus bar which includes thin plate-shaped capacitors 6 positioned at the required intervals along the elongated conductors. For this purpose, as exemplified in FIGS. 2 and 3, the conductors 1 and 3 are formed with rectangular cut-outs or apertures 1A and 3A for receiving capacitors 6 at predetermined intervals. During assembly of the bus bar the cut-outs 1A and 3A are positioned in registration with each other and thin capacitors 6 are inserted in these cut-outs. Referring to FIG. 4, the capacitors 6 preferably comprise thin ceramic plates 7, characterized by a high dielectric constant, and conductive layers 8 and 9 on the top and bottom surfaces thereof respectively. The capacitors 6 will be prepared beforehand, according to the present invention.

Figure 6:
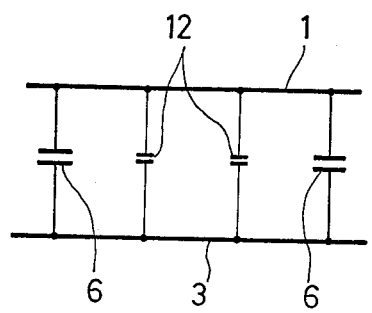
FIG. 6 is the equivalent electrical circuit diagram of the bus bar of FIG. 5.
Figure 5:
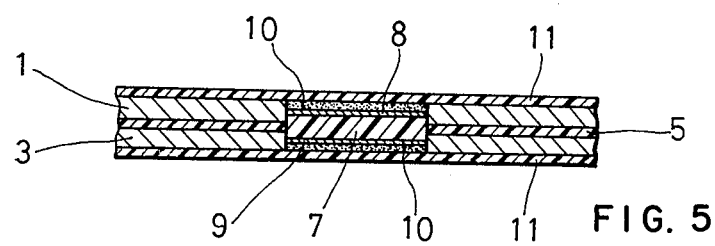
FIG. 5 is a general enlarged cross-sectional view of a preferred embodiment of the bus bar of the present invention.

In manufacturing a laminated bus bar as shown in FIG. 5, a pair of elongated conductors 1 and 3 are caused to adhere to opposite sides of a layer of insulating film 5 with the cut-outs 1A and 3A being in registration. The insulating film 5 will typically also have cut-outs which match the cut-outs in the conductors. Next, the capacitors 6 are inserted in the aligned cutouts in conductors 1 and 3 and insulating film 5. Subsequently, an electroconductive adhesive 10 is applied over the plates 8 and 9 of the capacitors 6 to establish electrical connection between respective conductors 1 and 3 and capacitor plates 8 and 9. Lastly, a surface insulating cover film 11 is overlaid on the exposed surface of each of conductors 1 and 3 through the interposition of the adhesive material, thus forming the whole bus bar into an integral assembly. Thus, the capacitors will be held in positioned and will be electrically connected to said conductors 1 and 3 by the electroconductive adhesive layer 10. Consequently, the laminated bus bar thus obtained is provided with the capacitors 6 embedded therein, together with a distribution capacity 12 formed by said insulating film layer 5, as shown in FIG. 6. Therefore, this laminated bus bar will be characterized by a high capacitance.

In particular, the capacitors 6 remain integrally embedded in the laminated bus bar. Since the bus bar requires no lead wires which are likely to be accompanied by an increase in impedance, the special impedance of the bus bar is found to be very good.

Figure 7:
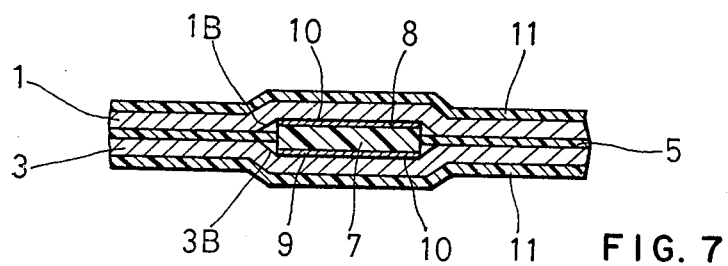
FIG. 7 is a general enlarged cross-sectional view of a laminated bus bar in accordance with a second embodiment of the present invention.

In the above-described embodiment, said cut-outs 1A and 3A have been formd in said conductors 1 and 3 as means for incorporating the capacitors 6 therein. As an alternative, as shown in FIG. 7, recesses 1B and 3B can be formed in the conductors 1 and 3 for the purpose of receiving capacitors 6.

As in the case of the FIG. embodiment, it is possible to establish electrical contact between the electroconductive layers 7 and 8 of said capacitors 6 and each conductor by means of said electroconductive adhesive material 10. In the embodiment of FIG. 7, the assembly of the bus bar and embedding of capacitors 6 therein can be attained more conveniently than ever before. Moreover, the electrical contact between the electroconductive layers 7 and 8 of the capacitors 6 and the conductors 1 and 3 may be more easily and surely effected than with the FIG. 5 embodiment.

According to the present invention, since capacitors can be embedded in a bus bar having the required capacity without basically modifying the conventional steps for the manufacture of a laminated bus bar, it is possible to provide bus bars characterized by a capacitance most suitable for the intended use whereby it also becomes possible to design a power distribution system in a very rational manner taking into account the integration of electronic circuits on a large scale.

What is claimed is:

1. A multi-conductor bus bar assembly comprising:
a first bus conductor, said first conductor being formed from an elongated flat strip of conductive material;
at least a second bus conductor, said second conductor being formed from an elongated flat strip of conductive material;
a layer of insulating material bonded to and separating said conductors, said insulating material being provided with a series of longitudinally spaced cut-outs;
a plurality of capacitors, said capacitors being individually positioned in said cut-outs in said layer of insulating material, said capacitors each comprising a flat wafer of solid dielectric material with plates defined by conductive material disposed on the sides of the wafer which face said conductors; and
means for electrically and mechanically connecting the plates of said capacitors to said conductors.

2. The bus bar assembly of claim 1 wherein at least said first conductor is provided with longitudinally spaced irregularities in registration with the cut-outs in said layer of insulating material, said capacitors extending into said irregularities.

3. The bus bar assembly of claim 2 wherein said second bus conductor is also provided with longitudinal spaced irregularities, the irregularities in said second conductor also being positioned in registration with the cut-outs in said layer of insulating material.

4. The bus bar assembly of claim 3 wherein said irregularities in said first and second bus conductors consist of cut-outs commensurate in size and shape with the capacitors, said capacitors extending to either side of said layer of insulating material and into said conductor cut-outs.

5. The bus bar assembly of claim 3 wherein said irregularities in said bus conductors comprise depressions which extend outwardly with respect to said layer of insulating material, said depressions being sized and shaped to receive said capacitors whereby the capacitors extend to either side of the layer of insulating material and into said depressions.

6. The bus bar assembly of claim 4 wherein the dielectric wafer of said capacitor is comprised of a ceramic material.

7. The bus bar assembly of claim 5 wherein the dielectric wafer of said capacitor is comprised of a ceramic material.

8. The bus bar assembly of claim 6 wherein said means for electrically and mechanically connecting said capacitor plates to said conductors comprises a conductive adhesive.

9. The bus bar assembly of claim 7 wherein said means for electrically and mechanically connecting said capacitor plates to said conductors comprises a conductive adhesive.

10. The bus bar assembly of claim 8 further comprising:
a film of insulating material covering the outwardly facing sides of said bus conductors, said film of insulating material extending over said cut-outs.

11. The bus bar assembly of claim 9 further comprising:
a film of insulating material covering the outwardly disposed sides of each of said bus conductors.

* * * * *